(12) United States Patent
Hashiguchi

(10) Patent No.: US 8,770,043 B2
(45) Date of Patent: Jul. 8, 2014

(54) COMB-STRUCTURED MEMS ACCELEROMETER

(75) Inventor: Gen Hashiguchi, Hamamatsu (JP)

(73) Assignee: National University Corporation Shizuoka University (JP)

( * ) Notice: Subject to any disclaimer, the term of this patent is extended or adjusted under 35 U.S.C. 154(b) by 444 days.

(21) Appl. No.: 12/996,270

(22) PCT Filed: Jun. 5, 2009

(86) PCT No.: PCT/JP2009/060364
§ 371 (c)(1),
(2), (4) Date: Feb. 28, 2011

(87) PCT Pub. No.: WO2009/148156
PCT Pub. Date: Dec. 10, 2009

(65) Prior Publication Data
US 2011/0138931 A1    Jun. 16, 2011

(30) Foreign Application Priority Data
Jun. 5, 2008    (JP) ................................ P2008-148657

(51) Int. Cl.
*G01L 1/10*    (2006.01)
*G01P 15/00*    (2006.01)

(52) U.S. Cl.
USPC ..................................... 73/862.59; 73/514.16

(58) Field of Classification Search
USPC ............................. 73/514.16, 862.59, 514.32
See application file for complete search history.

(56) References Cited

U.S. PATENT DOCUMENTS

| | | | | |
|---|---|---|---|---|
| 5,209,117 | A * | 5/1993 | Bennett | 73/514.16 |
| 5,606,214 | A * | 2/1997 | Corsaro | 310/329 |
| 6,473,290 | B2 * | 10/2002 | Mochida | 361/291 |
| 6,484,578 | B2 * | 11/2002 | Woodruff et al. | 73/514.29 |

(Continued)

FOREIGN PATENT DOCUMENTS

| | | |
|---|---|---|
| CN | 1580786 | 2/2005 |
| JP | 9-79921 | 3/1997 |

(Continued)

OTHER PUBLICATIONS

International Search Report issued Sep. 1, 2009.

(Continued)

*Primary Examiner* — Lisa Caputo
*Assistant Examiner* — Nasir U Ahmed
(74) *Attorney, Agent, or Firm* — Ostrolenk Faber LLP

(57) ABSTRACT

An object of this invention is to detect an external force or acceleration with good sensitivity using a simple configuration. An external force detection sensor comprises a comb electrode including a fixed electrode having a plurality of fixed combtooth portions and a movable electrode having a plurality of movable combtooth portions inserted between the fixed combtooth portions; a power supply connected to the fixed electrode and the movable electrode in order to cause vibration of the movable electrode at a prescribed resonance frequency through an electrostatic force on the fixed electrode; and detection means for detecting an external force based on a change in electrical characteristics between the fixed electrode and the movable electrode when the movable electrode is caused to vibrate. With respect to the fixed combtooth portions that are adjacent to each other and the movable combtooth portion inserted therebetween, the spacing between one of the fixed combtooth portions and the movable combtooth portion is different from the spacing between another of the fixed combtooth portions and the movable combtooth portion.

6 Claims, 7 Drawing Sheets

(56) References Cited

U.S. PATENT DOCUMENTS

| | | | |
|---|---|---|---|
| 6,705,166 B2 * | 3/2004 | Leonardson | 73/514.32 |
| 6,792,804 B2 * | 9/2004 | Adams et al. | 73/514.32 |
| 6,874,363 B1 * | 4/2005 | Foote et al. | 73/514.29 |
| 7,243,545 B2 * | 7/2007 | Sakai et al. | 73/514.32 |
| 7,559,242 B2 * | 7/2009 | Wang et al. | 73/651 |
| 7,849,745 B2 * | 12/2010 | Wang et al. | 73/514.34 |
| 2005/0132805 A1 * | 6/2005 | Park et al. | 73/514.32 |
| 2005/0276726 A1 * | 12/2005 | McGill et al. | 422/96 |
| 2006/0057758 A1 * | 3/2006 | Yokoyama | 438/51 |
| 2007/0272015 A1 * | 11/2007 | Kazama et al. | 73/504.08 |

FOREIGN PATENT DOCUMENTS

| | | | | |
|---|---|---|---|---|
| JP | 10-153429 | 6/1998 | | |
| JP | 10-206457 | 8/1998 | | |
| JP | 2000-131072 | 5/2000 | | |
| JP | 2002-39759 | 2/2002 | | |
| JP | 2002-323323 | 11/2002 | | |
| JP | 2002323323 A | * 11/2002 | | G01C 19/56 |

OTHER PUBLICATIONS

English translation of International Preliminary Report on Patentability issued Jan. 20, 2011, in corresponding PCT Application No. PCT/JP2009/060364.

Chinese Office Action issued Jan. 18, 2012 in connection with corresponding Chinese Patent Application No. 200980120861.0.

Tsutomu Obata et al., "Development of two-axis gyroscope sensor and study of properties", Research Report of the Toyama Industrial Technology Center, 2007, No. 21, p. II-45-p. II-46.

* cited by examiner

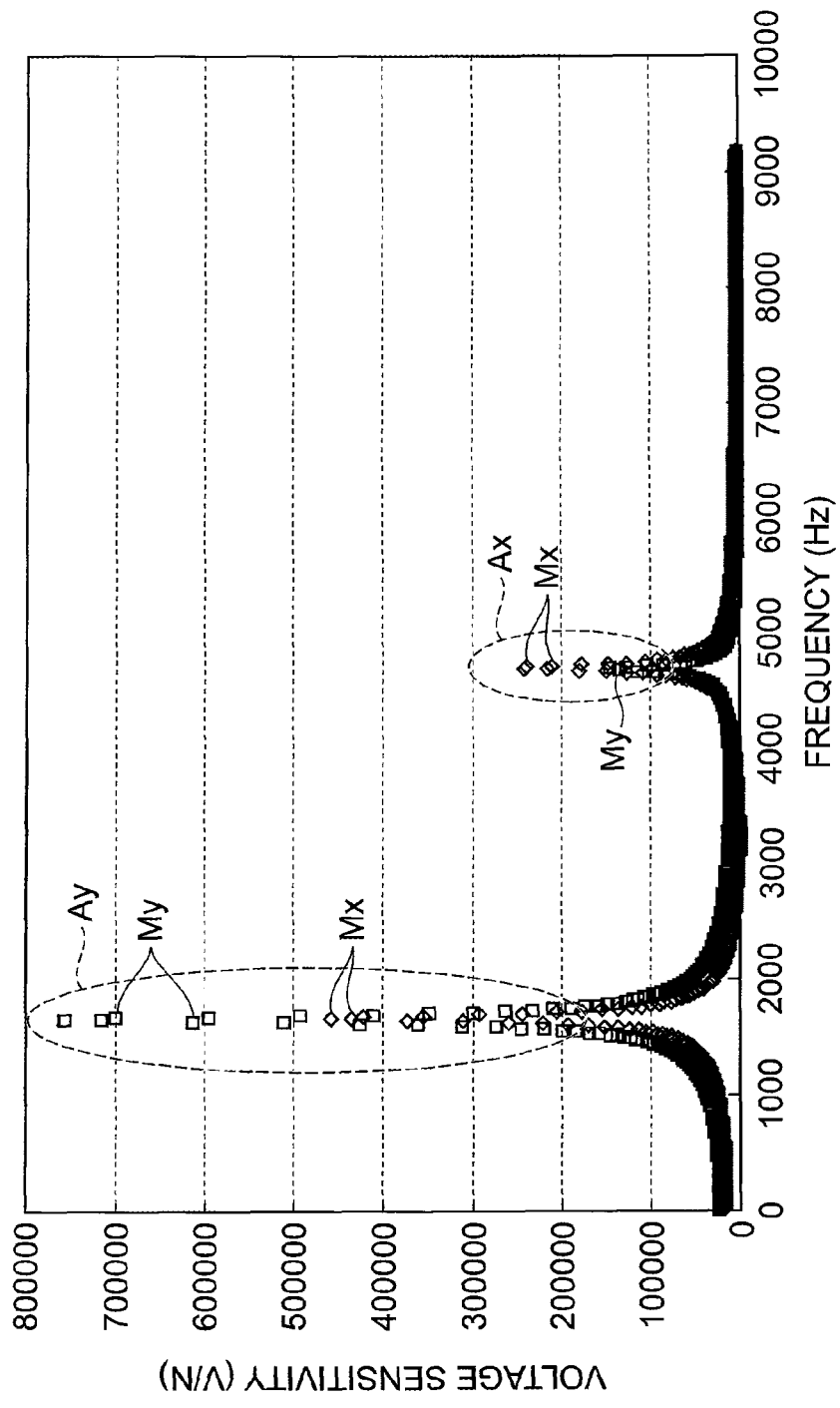

COMB-STRUCTURED MEMS ACCELEROMETER

CROSS REFERENCE TO RELATED APPLICATIONS

The present application is a 35 U.S.C. §371 national phase conversion of PCT/JP2009/060364 filed Jun. 5, 2009 and claims priority of JP2008-148657 filed Jun. 5, 2008, both incorporated herein in their entirety.

TECHNICAL FIELD

This invention relates to a detection sensor which detects external forces or accelerations.

BACKGROUND ART

Sensors which detect external forces or accelerations include for example acceleration sensors and displacement sensors. Of these, acceleration sensors generally use a technique in which the static displacement of a moveable mass is detected using the change in capacitance or using a strain resistance method. For example, Patent Literature 1 below discloses an acceleration sensor which detects displacement through changes in electrostatic capacitance.

CITATION LIST

Patent Literature

Patent Literature 1: Japanese Patent Application Laid-open No. 10-206457

SUMMARY OF INVENTION

Technical Problem

However, when detecting changes in electrostatic capacitance using an electrostatic actuator, measures are necessary to improve sensitivity, and the strain resistance method tends to complicate the device.

This invention was devised in order to resolve the above problem, and has as an object the provision of a detection sensor which can detect external forces or accelerations with good sensitivity, using a simple configuration.

Solution to Problem

A detection sensor of this invention comprises a comb electrode, including a fixed electrode having a plurality of fixed combtooth portions and a movable electrode having a plurality of movable combtooth portions inserted between fixed combtooth portions; a power supply connected to the fixed electrode and the movable electrode in order to cause vibration of the movable electrode at a prescribed resonance frequency through an electrostatic force on the fixed electrode; and, detection means for detecting an external force or acceleration based on a change in electrical characteristics between the fixed electrode and the movable electrode when the movable electrode is caused to vibrate, wherein with respect to the fixed combtooth portions that are adjacent to each other and the movable combtooth portion inserted therebetween, the spacing between one of the fixed combtooth portions and the movable combtooth portion is different from the spacing between another of the fixed combtooth portions and the movable combtooth portion.

By means of such a detection sensor, with respect to adjacent fixed combtooth portions and a movable combtooth portion inserted therebetween, the spacings between the fixed combtooth portions and the movable combtooth portion are different on the left and on the right, so that when the movable electrode is made to vibrate by an electrostatic force at a prescribed resonance frequency, when an external force acts, the electrical characteristics between the fixed electrode and the movable electrode changes considerably. Hence by detecting this change, the external force or acceleration can be detected with good sensitivity. Further, the device configuration is also simple.

In a detection sensor of this invention, it is preferable that the power supply impart electric power at a resonance frequency which causes the movable electrode to vibrate in an arrangement direction of the movable combtooth portions.

In this case, the movable electrode vibrates in the arrangement direction of the movable combtooth portions, so that external forces or accelerations in this arrangement direction in particular can be detected with good sensitivity.

In a detection sensor of this invention, it is preferable that the power supply impart electric power at a resonance frequency which causes the movable electrode to vibrate in an extension direction of the movable combtooth portions.

In this case, the movable electrode vibrates in the extension direction of the movable combtooth portions, so that external forces or accelerations in this extension direction in particular can be detected with good sensitivity.

In a detection sensor of this invention, it is preferable that the power supply change a direction of vibration of the movable electrode by switching the prescribed frequency between a first resonance frequency which causes vibration in an arrangement direction of the movable combtooth portions and a second resonance frequency which causes vibration in an extension direction of the movable combtooth portions, and that the movable electrode vibrate in the arrangement direction of the movable combtooth portions at the first resonance frequency, and vibrate in the extension direction of the movable combtooth portions at the second resonance frequency.

In this case, when the movable electrode vibrates in the arrangement direction of the movable combtooth portions, an external force or acceleration applied in the arrangement direction can be detected with particularly good sensitivity, and when the movable electrode vibrates in the extension direction of the movable combtooth portions, an external force or acceleration applied in the extension direction can be detected with particularly good sensitivity. Further, by switching the resonance frequency through the power supply, the direction of vibration of the movable electrode is changed, so that simply by switching the resonance frequency according to the direction of the external force or acceleration to be detected, an external force or acceleration can be detected with high sensitivity.

In a detection sensor of this invention, it is preferable that the power supply generate a signal in which are superposed a first resonance frequency which causes the movable electrode to vibrate in an arrangement direction of the movable combtooth portions, and a second resonance frequency which causes the movable electrode to vibrate in an extension direction of the movable combtooth portions.

In this case, the movable electrode is caused to vibrate at a resonance frequency in the arrangement direction of the movable combtooth portions, and the movable electrode is caused to vibrate at a resonance frequency in the extension direction of the movable combtooth portions. In this case, the resonance frequencies which change due to an external force or acceleration in the arrangement direction of the movable combtooth portions and extension direction are different, so that external forces and accelerations can be detected separately and with high sensitivity in each of these directions, without performing frequency switching.

In a detection sensor of this invention, it is preferable that the length of the fixed combtooth portions in a direction perpendicular to an extension direction and an arrangement direction of the fixed combtooth portions be different from the length of the movable combtooth portions in a direction perpendicular to an extension direction and an arrangement direction of the movable combtooth portions, and that the power supply impart electric power at a resonance frequency which causes vibration of the movable electrode in the direction perpendicular to the extension direction and the arrangement direction of the movable combtooth portions.

In this case, the length of the fixed combtooth portions in the direction perpendicular to the extension direction and the arrangement direction of the fixed combtooth portions (the height direction), and the length of the movable combtooth portions in the direction perpendicular to the extension direction and the arrangement direction of the movable combtooth portions (the height direction), are different, so that when the movable electrode is caused to vibrate at a prescribed resonance frequency, an external force or acceleration can be detected in the height direction as well by acquiring electrical characteristics between the fixed electrode and the movable electrode.

In a detection sensor of this invention, it is preferable that the power supply generate a signal in which a DC bias signal is superposed on the signal at the resonance frequency.

Advantageous Effects of Invention

By means of such a detection sensor, by causing the spacings between the fixed combtooth portions and the movable combtooth portions to be different on the left and on the right, an external force or acceleration can be detected through changes in the electrical characteristics between the fixed electrode and the movable electrode when an electrostatic force at a resonance frequency is imparted to the movable electrode. As a result, external forces or accelerations can be detected with good sensitivity using a simple configuration.

BRIEF DESCRIPTION OF DRAWINGS

FIG. 7 is a graph showing the relation between resonance frequency and voltage sensitivity.

DESCRIPTION OF EMBODIMENTS

Below, an embodiment of the invention is explained in detail, referring to the attached drawings. In this embodiment, a detection sensor of this invention is applied to an external force detection sensor. In explanations of the drawings, the same or equivalent elements are assigned the same symbols, and redundant explanations are omitted.

Figure 1:
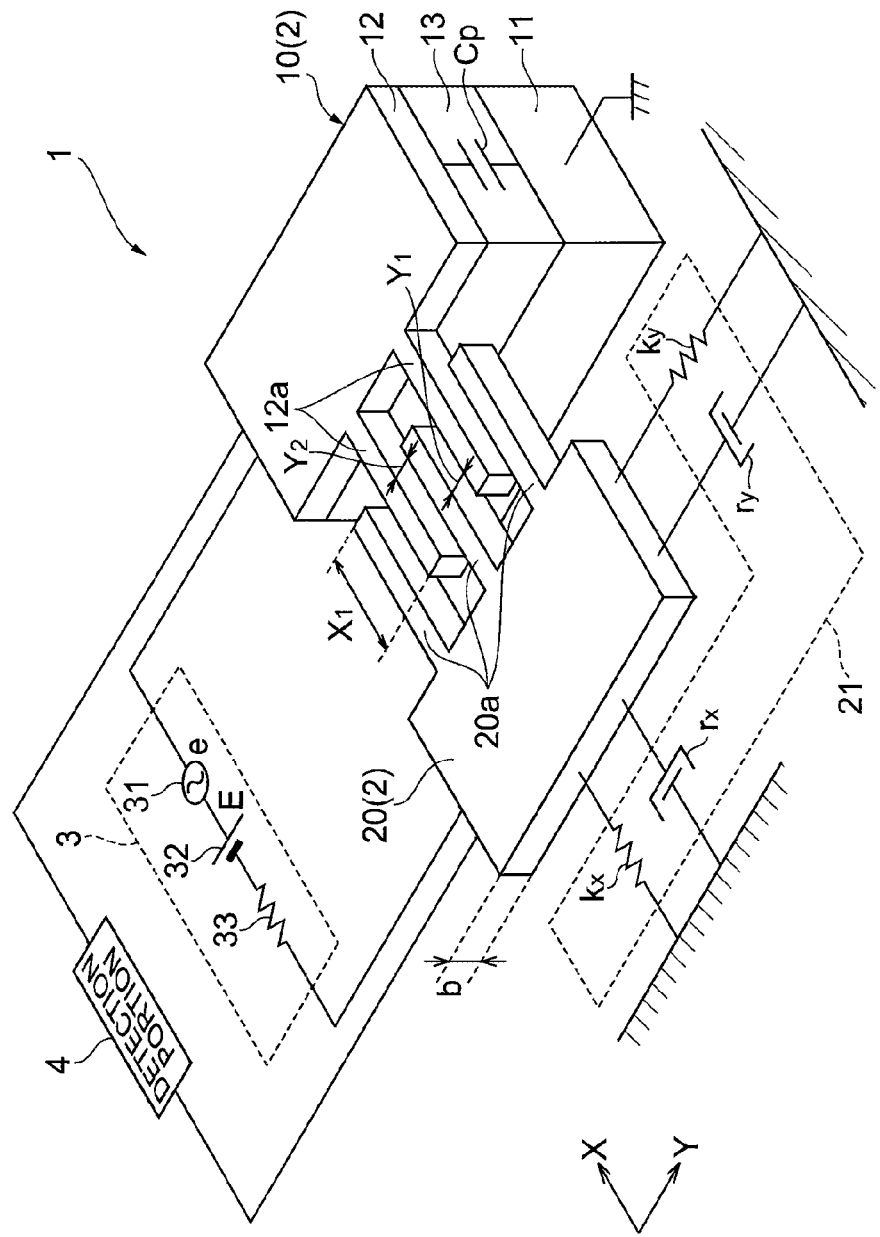
FIG. 1 is a perspective view schematically showing the overall configuration of the external force detection sensor of an embodiment.
Figure 2A:
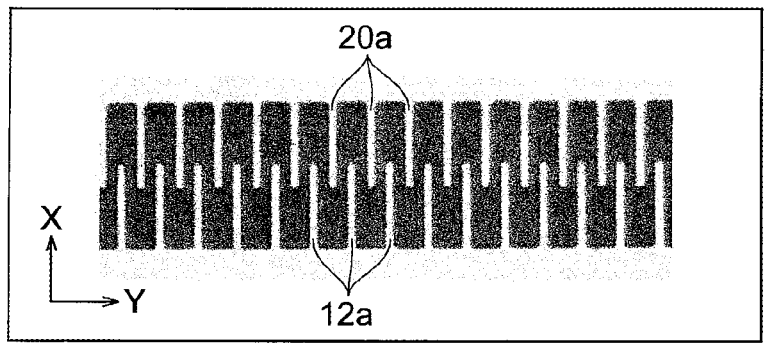
FIG. 2(a) through FIG. 2(c) are photographs showing the manner of vibration of a movable electrode.
Figure 2B:
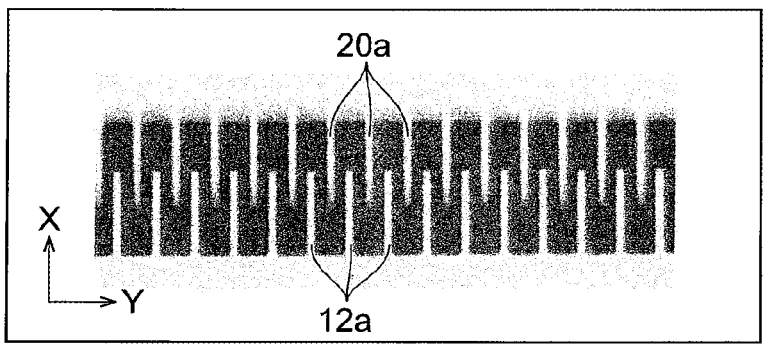
Figure 2C:
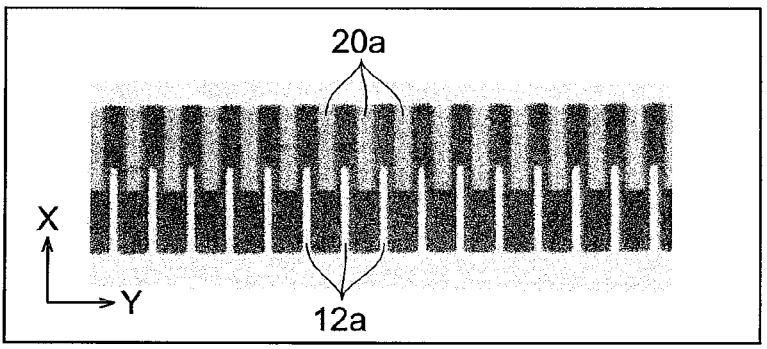
Figure 3:
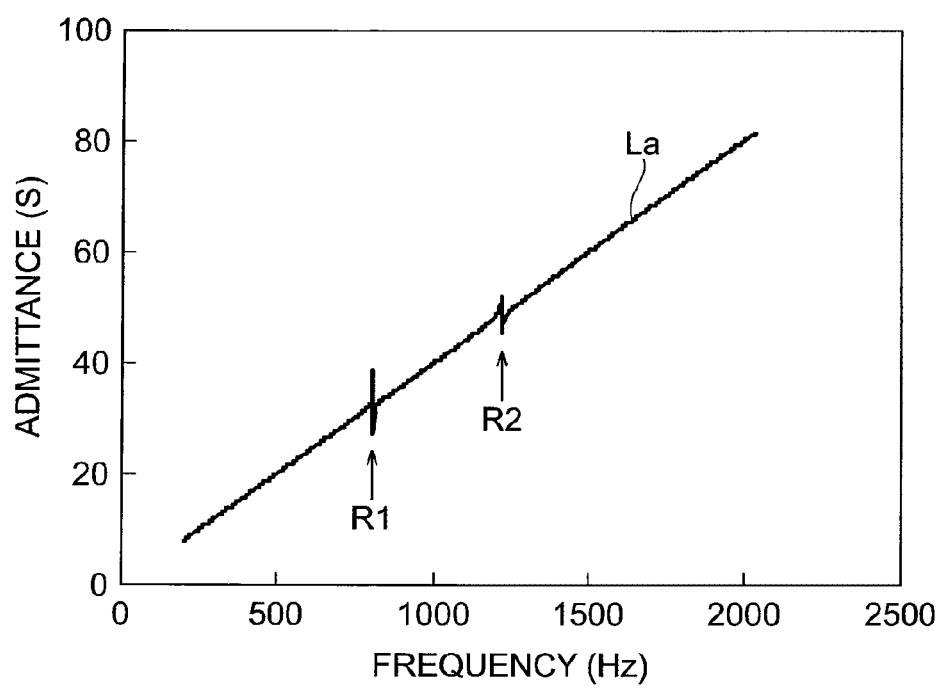
FIG. 3 is a graph showing the relation between admittance and frequency.
Figure 4:
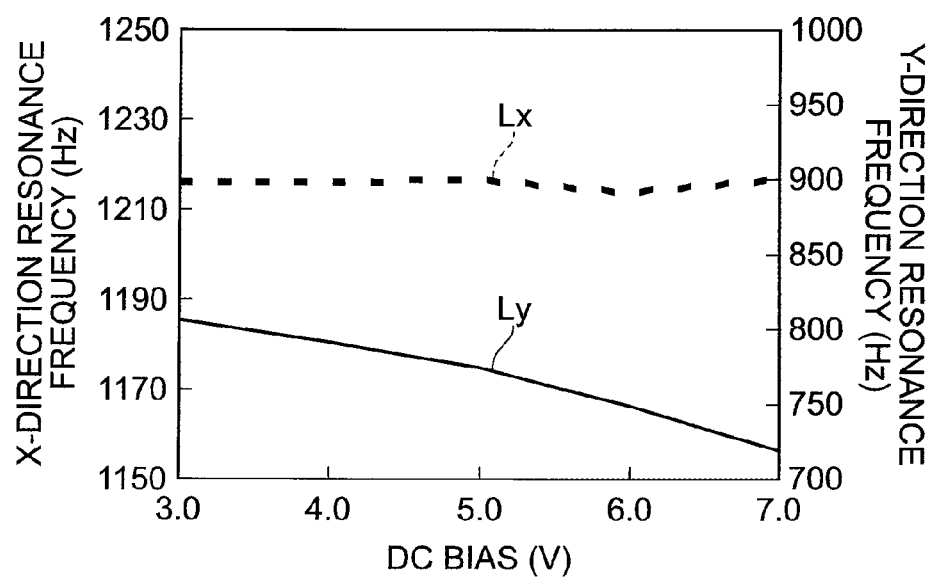
FIG. 4 is a graph showing the relation between resonance frequency and DC bias.
Figure 5:
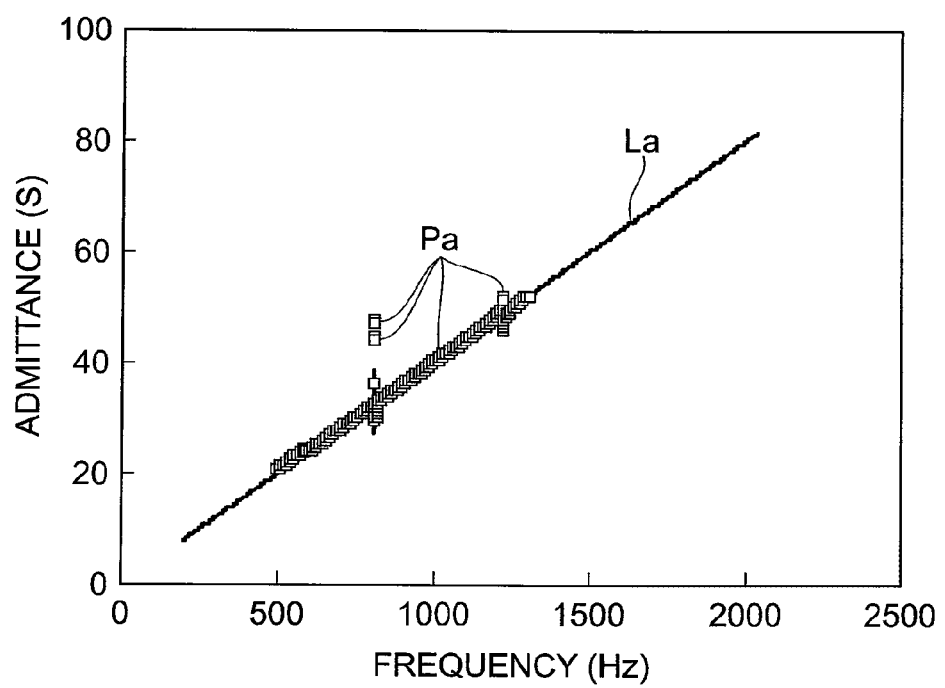
FIG. 5 is a graph showing a comparison of analytic values and measured values of an admittance curve.
Figure 6:
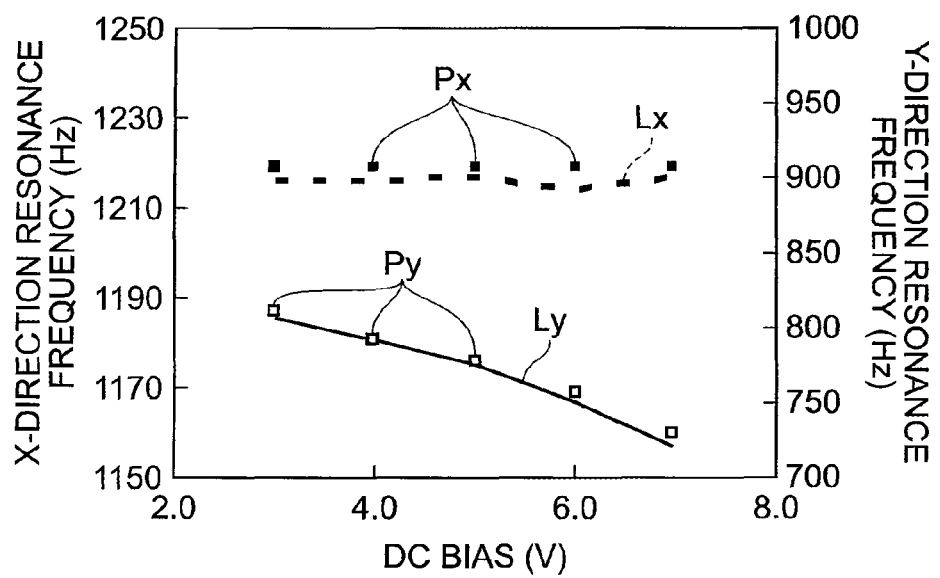
FIG. 6 is a graph showing a comparison of analytic values and measured values relating to the DC bias dependence of the resonance frequency.

FIG. 1 is a perspective view schematically showing the overall configuration of the external force detection sensor of the embodiment. FIG. 2(a) through FIG. 2(c) are photographs showing the manner of vibration of a movable electrode. FIG. 3 is a graph showing the relation between admittance and frequency. FIG. 4 is a graph showing the relation between resonance frequency and DC bias. FIG. 5 is a graph showing a comparison of analytic values and measured values of an admittance curve. FIG. 6 is a graph showing a comparison of analytic values and measured values relating to the DC bias dependence of the resonance frequency. FIG. 7 is a graph showing the relation between resonance frequency and voltage sensitivity.

The external force detection sensor 1 comprises a comb electrode 2, power supply 3, and detection portion (detection means) 4. The comb electrode 2 has a fixed electrode 10 and a movable electrode 20.

The fixed electrode 10 comprises a lower silicon layer 11, an upper silicon layer 12, and an insulating layer 13 enclosed between these upper and lower silicon layers. The upper silicon layer 12 has a plurality of fixed combtooth portions 12a, protruding in a convex shape.

The movable electrode 20 is formed from silicon, and is supported by an elastic support portion 21. The movable electrode 20 has a plurality of movable combtooth portions 20a, protruding in a convex shape. The movable combtooth portions 20a are arranged so as to be inserted between the adjacent fixed combtooth portions 12a. That is, the fixed combtooth portions 12a of the fixed electrode 10 and the movable combtooth portions 20a of the movable electrode 20 are arranged so as to mesh with a constant gap. As a result, the fixed electrode 10 (upper silicon layer 12) and the movable electrode 20 are opposed.

With respect to adjacent fixed combtooth portions 12a and the movable combtooth portion 20a inserted therebetween, the spacing between one of the fixed combtooth portions 12a and the movable combtooth portion 20a ($Y_1$ in FIG. 1) is different from the spacing between another of the fixed combtooth portions 12a and the movable combtooth portion 20a ($Y_2$ in FIG. 1).

The power supply 3 is a device to cause vibration of the movable electrode 20 with respect to the fixed electrode 10, and comprises an AC power supply 31, DC power supply 32, and resistance portion 33. The power supply 3 is connected to the fixed electrode 10 and movable electrode 20. A bias voltage is applied across the fixed electrode 10 and movable electrode 20 by the DC power supply 32, and by superposing and applying an AC voltage by means of the AC power supply 31, the movable electrode 20 vibrates with respect to the fixed electrode 10. The power supply 3 causes the movable electrode 20 to vibrate in a specific direction by means of an electrostatic force at a prescribed resonance frequency.

The manner of vibration of the movable electrode 20 by the power supply 3 is shown in FIG. 2. FIG. 2(a) is a photograph of a state in which the movable electrode 20 is not yet vibrating. FIG. 2(b) is a photograph of a state in which the movable combtooth portions 20a (movable electrode 20) is vibrating in the X direction due to application of a certain specific resonance frequency (second frequency). FIG. 2(c) is a photograph of a state in which the movable combtooth portions 20a (movable electrode 20) is vibrating in the Y direction due to application of a certain specific resonance frequency (first frequency) different from the second frequency. Here, the X direction is the direction of extension of the fixed combtooth portions 12a and the movable combtooth portions 20a, and the Y direction is the direction of arrangement of the fixed combtooth portions 12a and the movable combtooth portions 20a. In this way, the power supply 3 changes the direction of vibration of the movable electrode 20 by switching the resonance frequency.

The power supply 3 may cause the movable electrode 20 to vibrate using the electrostatic force of a signal obtained by superposing the first resonance frequency, which causes the movable electrode 20 to vibrate in the Y direction, and the second resonance frequency, which causes the movable electrode 20 to vibrate in the X direction. In this case, the movable electrode 20 vibrates in the direction of a diagonal line.

The detection portion 4 is a portion which detects an external force based on the change in electrical characteristics between the fixed electrode 10 and the movable electrode 20 when the movable electrode 20 is caused to vibrate at a prescribed resonance frequency. In FIG. 1, the detection portion 4 is connected to the fixed electrode 10 and movable electrode 20, but may be connected to both ends of a resistance portion 33, or may be connected to both ends of the power supply 3. Further, the power supply 3 and detection portion 4 may be connected in series.

Here, the principle of detection of an external force by the detection portion 4 is explained. When the X direction and Y direction are determined as described above, the Lagrangian of the external force detection sensor 1 which vibrates due to application of a DC voltage E and an AC voltage e is as given by equation (1) below.

[E1]

$$L = \frac{1}{2}mv_x^2 + \frac{1}{2}mv_y^2 - \frac{1}{2}k_x(X+x)^2 - \frac{1}{2}k_y(Y+y)^2 - \frac{1}{2}\frac{(Q_0+q)^2}{2C(x,y)+C_p} \quad (1)$$

Here, X and Y are displacement amounts in the X and Y directions of the movable combtooth portions 20a due to application of the DC voltage E. x and y are displacement amounts in the X and Y directions of the movable combtooth portions 20a due to application of the AC voltage e. $v_x$ and $v_y$ are movement velocities in the X direction and Y direction respectively. m is the mass of the movable electrode 20. $k_x$ and $k_y$ are spring constants for the X direction and Y direction respectively of the elastic support portion 21 supporting the movable electrode 20. C(x, y) is the electrostatic capacitance between the fixed electrode 10 and the movable electrode 20, and $C_p$ is the stray capacitance between the lower silicon layer 11 and the upper silicon layer 12. Further, $Q_0$ and q are values indicating electric charge amounts due to application of the DC voltage and the AC voltage respectively.

If the number of fixed combtooth portions 12a and the number of movable combtooth portions 20a (number of comb teeth) is n, and the height of each of the combtooth portions (the length in the vertical direction in FIG. 1) is b, then the electrostatic capacitance C(x, y) is as given by equation (2) below. Here $\epsilon_0$ is the permittivity of free space. Further, $X_0$ is the initial spacing (spacing when there is no vibration) between the fixed combtooth portions 12a and movable combtooth portions 20a along the X direction. Further, with respect to adjacent fixed combtooth portions 12a and a movable combtooth portion 20a inserted therebetween, $Y_1$ is the initial spacing between one of the fixed combtooth portions 12a and the movable combtooth portion 20a, and $Y_2$ is the initial spacing between another of the fixed combtooth portions 12a and the movable combtooth portion 20a.

[E2]

$$C(x,y) = n\epsilon_0 b(X_0 + X + x)\left(\frac{1}{Y_1 - Y - y} + \frac{1}{Y_2 + Y + y}\right) \quad (2)$$

Further, the energy dissipation function F for a system is given by equation (3) below as a function of the current i and velocities $v_x$ and $v_y$. Here $r_f$ and R are the mechanical resistance and electrical resistance respectively.

[E3]

$$F = \frac{1}{2}r_f v_x^2 + \frac{1}{2}r_f v_y^2 + \frac{1}{2}Ri^2 \quad (3)$$

The Lagrangian equations of motion for the mechanical coordinate system (X direction and Y direction) and for the electrical coordinate system are expressed as follows, using equations (1) and (2) above. Here, $f_x$ and $f_y$ are respectively the X component and Y component of the external force.

[E4]

$$f_x = \frac{d}{dt}\left(\frac{\partial L}{\partial v_x}\right) - \frac{\partial L}{\partial x} + \frac{\partial F}{\partial v_x} \quad (4)$$

[E5]

$$f_y = \frac{d}{dt}\left(\frac{\partial L}{\partial v_y}\right) - \frac{\partial L}{\partial y} + \frac{\partial F}{\partial v_y} \quad (5)$$

[E6]

$$E + e = \frac{d}{dt}\left(\frac{\partial L}{\partial i}\right) - \frac{\partial L}{\partial q} + \frac{\partial F}{\partial i} \quad (6)$$

Upon calculating the above Lagrangian motion equations (4) through (6), the following motions of equation (7) through (9), expressing the action of the external force detection sensor 1, are obtained. $E_0$ in equation (9) is the DC bias.

[E7]

$$f_x = m\frac{dv_x}{dt} + k_x(X+x) + r_x v_x - \frac{n\epsilon_0 b(Q_0+q)^2}{2\{C(x,y)+C_p\}^2}\left[\frac{1}{Y_1-Y-y} + \frac{1}{Y_2+Y+y}\right] \quad (7)$$

[E8]

$$f_y = m\frac{dv_y}{dt} + k_y(Y+y) + r_y v_y - \frac{n\epsilon_0 b(Q_0+q)^2(X_0+X+x)}{2\{C(x,y)+C_p\}^2}\left[\frac{1}{(Y_1-Y-y)^2} + \frac{1}{(Y_2+Y+y)^2}\right] \quad (8)$$

[E9]

-continued $$E + e = \frac{Q_0}{C_0 + C_p} - \frac{C_0 E_0}{(C_0 + C_p)(X_0 + X)} x - \frac{C_0 E_0}{(C_0 + C_p)} \left[ \frac{1}{Y_1 - Y} - \frac{1}{Y_2 + Y} \right] y + \frac{q}{C_0 + C_p} \quad (9)$$

Here, if it is assumed that the displacements x and y and the AC voltage e are very small, and consider a stationary state for the angular frequency ω, then by performing a Taylor expansion of the above equations (7) through (9) and taking first-degree terms, the following system of simultaneous equations (10) is obtained.

[E10]

$$\begin{pmatrix} f_x \\ f_y \\ i \end{pmatrix} = \begin{pmatrix} r_x + j\omega m + \frac{k_x}{j\omega} & -G & -D \\ -G & j\omega m + r_y + \frac{k_y}{j\omega} - \frac{1}{j\omega C_y''} & -B \\ D & B & j\omega(C_0 + C_p) \end{pmatrix} \begin{pmatrix} v_x \\ v_y \\ e \end{pmatrix} \quad (10)$$

Here, $C_0$ is the electrostatic capacitance when e=0, and is given by equation (11) below.

[E11]

$$C_0 = n\varepsilon_0 b(X_0 + X)\left( \frac{1}{Y_1 - Y} + \frac{1}{Y_2 + Y} \right) \quad (11)$$

Further, D, B, G, and $C_y''$ are given by equations (12) through (15) below, respectively. D and B are electromechanical coupling coefficients in the X direction and the Y direction respectively, and G is the interaction coefficient for X direction-Y direction mechanical vibrations.

[E12]

$$B = C_0 E_0 \left( \frac{1}{(Y_1 - Y)} - \frac{1}{(Y_2 + Y)} \right) \quad (12)$$

[E13]

$$D = \frac{C_0 E_0}{(X_0 + X)} \quad (13)$$

[E14]

$$G = \frac{n\varepsilon_0 b E_0^2}{2j\omega} \left\{ \frac{1}{(Y_1 - Y)^2} - \frac{1}{(Y_2 + Y)^2} \right\} \quad (14)$$

[E15]

$$\frac{1}{C_y''} = C_0 E_0^2 \left\{ \left( \frac{1}{(Y_1 - Y)} - \frac{1}{(Y_2 + Y)} \right)^2 + \frac{1}{(Y_1 - Y)(Y_2 + Y)} \right\} \quad (15)$$

As stated above, X and Y in equations (11) through (15) are the displacement amounts in the X and Y directions of the movable combtooth portions 20a due to the application of the DC voltage E; this can be derived from the following system of simultaneous equations (16), (17) obtained as 0th-degree terms of the Taylor expansions of equations (7) through (9).

[E16]

$$0 = k_x X - \frac{n\varepsilon_0 b E_0^2}{2} \left( \frac{1}{Y_1 - Y} + \frac{1}{Y_2 + Y} \right) \quad (16)$$

[E17]

$$0 = k_y Y - \frac{C_0 E_0^2}{2} \left( \frac{1}{(Y_1 - Y)} - \frac{1}{(Y_2 + Y)} \right) \quad (17)$$

FIG. 3 shows the admittance curve La seen from the electrical system, when $f_x = f_y = 0$ in the above equation (10) (when the external force is made 0). The vertical and horizontal axes of the graph in FIG. 3 are the admittance (S) and the frequency (Hz) respectively. The admittance curve La of FIG. 3 is an analysis result obtained when setting the parameters as indicated below.

Mass of movable electrode 20 m=1.9×10$^{-6}$ (kg)
X-direction spring constant $k_x$=111 (N/m)
Y-direction spring constant $k_y$=51 (N/m)
Number of teeth n=1070
Overlap in the X direction of fixed combtooth portions 12a and movable combtooth portions 20a $X_1$=10 (μm)
For adjacent fixed combtooth portions 12a and a movable combtooth portion 20a inserted therebetween, spacing in the Y direction between one fixed combtooth portion 12a and the movable combtooth portion 20a $Y_1$=2.5 μm
For adjacent fixed combtooth portions 12a and a movable combtooth portion 20a inserted therebetween, spacing in the Y direction between the other fixed combtooth portion 12a and the movable combtooth portion 20a $Y_2$=3.0 μm
X-direction mechanical resistance $r_x$=4.0×10$^{-5}$ (Ns/m)
Y-direction mechanical resistance $r_y$=1.0×10$^{-6}$ (Ns/m)
Stray capacitance $C_p$=4.65 (pF)
DC bias $E_0$=3 V As shown in FIG. 3, the comb electrode 2 has two resonance points (resonance frequencies) R1 and R2. Here, R1 is the resonance point at which the movable electrode 20 vibrates in the Y direction (the first resonance frequency; hereafter also called the "Y-direction resonance point"), and R2 is the resonance point at which the movable electrode 20 vibrates in the X direction (the second resonance frequency; hereafter also called the "X-direction resonance point"). In the above equations (10) through (14), when $Y_1 = Y_2$ and moreover Y=0, B and G are 0, and there is no mechanical coupling in either the X or Y directions, and no electromechanical coupling in the Y direction. From this, it can be said that the occurrence of resonance in the Y direction is excited by the fact that $Y_1$ and $Y_2$ are different.

Hence the movable electrode 20 can be caused to vibrate in the extension direction of the movable combtooth portions 20a (X direction), or in the arrangement direction of the movable combtooth portions 20a (Y direction), and an external force can be detected by measuring the change in admittance. To this end, the detection portion 4 comprises an impedance analyzer which detects the admittance and measures changes in phase, and an computation device in which is incorporated a computation program to which the above theory is applied. The detection portion 4 inputs a detected admittance to the computation device to calculate the direction of the external force, and outputs calculation results to a display device or to another computation device (neither shown).

The Y-direction resonance point shown in FIG. 3 depends on the DC bias $E_0$. This dependence relationship is shown in FIG. 4. The left-hand ordinate axis, right-hand ordinate axis, and abscissa axis of the graph in FIG. 4 respectively represent the X-direction resonance frequency (Hz), Y-direction resonance frequency (Hz), and DC bias (V). The broken line Lx in the graph indicates the transition of the X-direction resonance point, and the solid line Ly indicates the transition of the Y-direction resonance point. The Y-direction resonance point tends to increase together with a decrease in the DC bias $E_0$, and gradually approaches $E_0=0$, that is, the free resonance frequency determined by the Y-direction spring-mass system. On the other hand, the X-direction resonance point is not seen to exhibit a prominent dependence on the DC bias.

The Y-direction DC bias dependence is similar to the characteristics of a parallel-plate actuator. It is known that in a parallel-plate actuator, when the spacing between the plates decreases, the force pulling together between the two parallel plates increases, so that the resonance frequency of the immittance as seen from the electrical system decreases when the DC bias is increased. The Y-direction resonance point of the comb electrode 2 is also thought to decrease together with increases in the DC bias, for similar reasons. On the other hand, the X-direction resonance point does not change with the DC bias because the force pulling together the fixed electrode 10 and the movable electrode 20 does not change with the X-direction displacement.

In this way, the X-direction resonance frequency depends hardly at all on the DC bias, but the Y-direction resonance frequency depends on the DC bias. Hence by changing the DC bias, the resonance frequencies in the X direction and Y direction can be made to coincide, or one among the resonance frequencies in the X and Y directions can be made an integral multiple of the other. If the resonance frequencies in the X and Y directions are made the same or in an integral multiple relationship, then the path of vibrations is a stable path describing an ellipse or a Lissajous figure. In conventional MEMS (Micro-Electro Mechanical System) sensors which utilize one-dimensional reciprocal motion, inaccuracy has occurred in detection of external forces because of the existence of a point at which the velocity of the movable electrode is zero, due to the fact that the motion is reciprocal. On the other hand, by adopting this embodiment, the movable electrode 20 is always in motion and so there are no points at which the velocity is zero, and so external forces can be detected effectively. This embodiment is effective particularly when employing a MEMS sensor as a gyro-sensor.

FIG. 5 and FIG. 6 are graphs in which the results of experiments conducted under the same conditions as used in analyses are superimposed on the analytic results shown in FIG. 3 and FIG. 4. In FIG. 5, the experimental line La is the same admittance curve as in FIG. 3, and the white-filled square symbols Pa are measured values of the admittance. In FIG. 6, the broken line Lx and solid line Ly show the same resonance point transitions as in FIG. 4, and the black-filled square symbols Px are measured values of the X-direction resonance point, while white-filled square symbols Py are measured values of the Y-direction resonance point. As shown in FIG. 5 and FIG. 6, the results of experiments for the admittance curve and for the DC bias dependence of the resonance points in the X direction and Y direction coincide extremely well with analysis results.

As explained above, in this embodiment, with respect to adjacent fixed combtooth portions 12a and a movable combtooth portion 20a inserted therebetween, the spacings between the fixed combtooth portions 12a and the movable combtooth portion 20a are different on the left and right, and upon causing the movable electrode 20 to vibrate at a prescribed resonance frequency, when an external force is applied the electrical characteristics (admittance) between the fixed electrode 10 and the movable electrode 20 changes greatly. Hence by detecting this change the external force can be detected with good sensitivity. Further, the configuration of the external force detection sensor 1 is made simple.

Further, upon causing the movable electrode 20 in the external force detection sensor 1 to vibrate in the direction of arrangement of the movable combtooth portions 20a (the Y direction), an external force applied in this arrangement direction can be detected with particularly good sensitivity, and upon causing the movable electrode 20 to vibrate in the direction of extension of the movable combtooth portions 20a (the X direction), an external force applied in this extension direction can be detected with particularly good sensitivity.

This is shown in the graph of FIG. 7. The ordinate axis and abscissa axis of this graph indicate the voltage sensitivity (V/N) and frequency (Hz) respectively. The diamond symbols Mx in the graph denote the voltage sensitivity (the output voltage value of an impedance analyzer) when an external force was applied in the extension direction of the movable combtooth portions 20a (the X direction); the square symbols My denote the voltage sensitivity when an external force was applied in the arrangement direction of the movable combtooth portions 20a (the Y direction). The area enclosed by the broken line Ax indicates the vicinity of resonance points at which the movable electrode 20 vibrates in the X direction (X-direction resonance points); the area enclosed by the broken line Ay indicates the vicinity of resonance points at which the movable electrode 20 vibrates in the Y direction (Y-direction resonance points). The DC bias $E_0$ is 5 V.

As is clear from FIG. 7, the external force detection sensor 1 can detect external forces in the X direction and Y direction with good sensitivity at resonance points in the X direction and Y direction. In particular, in the vicinity Ay of the Y-direction resonance point the external detection sensor 1 can detect external forces applied in the Y direction with extremely good sensitivity, and in the vicinity Ax of the X-direction resonance point can detect external forces applied in the X direction with extremely good sensitivity. Hence by switching the resonance frequency of the power supply 3, the direction of external forces to be detected can be detected with high sensitivity. Further, in a case in which the movable electrode 20 is caused to vibrate by an electrostatic force in which are superposed the first resonance frequency causing vibration of the movable electrode 20 in the Y direction and the second resonance frequency causing vibration of the movable electrode 20 in the X direction, external forces applied in the X direction or in the Y direction can be detected with high sensitivity, without frequency switching by the power supply 3.

When the resonance frequency is shifted slightly in the X direction and Y direction to cause resonance motion in the X direction, if there is displacement in the Y direction, the Y direction amplitude suddenly becomes large. By utilizing this, a sensor with high Y-direction detection sensitivity can be realized.

In the above, the invention has been described in detail based on an embodiment. However, the invention is not limited to the above-described embodiment. This invention can be modified in various ways, such as those described below, without deviating from the gist thereof.

In the above embodiment, the external detection sensor 1 detects external forces in the X direction and Y direction (two-dimensional space), but may be made to detect external forces in the X, Y, and Z directions (three-dimensional space).

Here, the Z direction is the direction perpendicular to the direction of extension and the direction of arrangement of the fixed combtooth portions (or the movable combtooth portions). In this case, with respect to adjacent fixed combtooth portions and a movable combtooth portion inserted therebetween, the spacing between one of the fixed combtooth portions and the movable combtooth portion is made different from the spacing between the other fixed combtooth portion and the movable combtooth portion, and the lengths in the Z direction of the fixed combtooth portions and the movable combtooth portion are made different. Further, by causing the movable electrode to vibrate in the Z direction at a resonance frequency (third resonance frequency) different from the resonance points for the X direction and Y direction, external forces in the X and Y directions can be detected with good sensitivity, and moreover external forces in the Z direction can be detected with particularly good sensitivity.

In the above embodiment, a detection sensor of this invention was applied to an external force detection sensor, but this invention may also be applied to a sensor which detects acceleration.

A probe can be attached to the movable electrode of a detection sensor of this invention, to realize a contact sensor which detects external forces from the probe. Such a contact sensor can for example be used as a probe of an atomic force microscope (AFM).

REFERENCE SIGNS LIST

1 External force detection sensor
2 Comb electrode
3 Power supply
4 Detection portion (detection means)
10 Fixed electrode
12a Fixed combtooth portion
20 Movable electrode
20a Movable combtooth portion

The invention claimed is:

1. A detection sensor, comprising:
a comb electrode, including a fixed electrode having a plurality of fixed combtooth portions and a movable electrode having a plurality of movable combtooth portions inserted between the fixed combtooth portions;
a power supply, connected to the fixed electrode and the movable electrode in order to cause vibration of the movable electrode at a prescribed resonance frequency through an electrostatic force on the fixed electrode; and
a detection unit for detecting an external force or acceleration based on a change in electrical characteristics between the fixed electrode and the movable electrode when the movable electrode is caused to vibrate,
wherein with respect to the fixed combtooth portions that are adjacent to each other and the movable combtooth portion inserted therebetween, the spacing between one of the fixed combtooth portions and the movable combtooth portion is different from the spacing between another of the fixed combtooth portions and the movable combtooth portion, and
wherein the power supply changes a direction of vibration of the movable electrode by switching the prescribed frequency, between a first resonance frequency which causes vibration in an arrangement direction of the movable combtooth portions, and a second resonance frequency which causes vibration in an extension direction of the movable combtooth portions,
wherein the movable electrode vibrates in the arrangement direction of the movable combtooth portions at the first resonance frequency, and vibrates in the extension direction of the movable combtooth portions at the second resonance frequency; and
wherein the power supply generates a signal in which a DC bias signal is superposed on the signal at the prescribed resonance frequency.

2. The detection sensor according to claim 1, wherein the length of the fixed combtooth portions in a direction perpendicular to an extension direction and an arrangement direction of the fixed combtooth portions are different from the length of the movable combtooth portions in a direction perpendicular to an extension direction and an arrangement direction of the movable combtooth portions, and the power supply imparts electric power at a resonance frequency which causes vibration of the movable electrode in the direction perpendicular to the extension direction and the arrangement direction of the movable combtooth portions.

3. The detection sensor according to claim 1, wherein one of the first resonance frequency and the second resonance frequency is an integral multiple of the other.

4. A detection sensor, comprising:
a comb electrode, including a fixed electrode having a plurality of fixed combtooth portions and a movable electrode having a plurality of movable combtooth portions inserted between the fixed combtooth portions;
a power supply, connected to the fixed electrode and the movable electrode in order to cause vibration of the movable electrode at resonance frequencies through an electrostatic force on the fixed electrode; and
a detection unit for detecting an external force or acceleration based on a change in electrical characteristics between the fixed electrode and the movable electrode when the movable electrode is caused to vibrate,
wherein with respect to the fixed combtooth portions that are adjacent to each other and the movable combtooth portion inserted therebetween, the spacing between one of the fixed combtooth portions and the movable combtooth portion is different from the spacing between another of the fixed combtooth portions and the movable combtooth portion,
wherein the power supply generates a signal in which are superposed a first resonance frequency which causes the movable electrode to vibrate in an arrangement direction of the movable combtooth portions, and a second resonance frequency which causes the movable electrode to vibrate in an extension direction of the movable combtooth portions; and
wherein a DC bias signal is superposed on said signal generated by said power supply.

5. The detection sensor according to claim 4, wherein the length of the fixed combtooth portions in a direction perpendicular to an extension direction and an arrangement direction of the fixed combtooth portions are different from the length of the movable combtooth portions in a direction perpendicular to an extension direction and an arrangement direction of the movable combtooth portions, and the power supply imparts electric power at a resonance frequency which causes vibration of the movable electrode in the direction perpendicular to the extension direction and the arrangement direction of the movable combtooth portions.

6. The detection sensor according to claim 4, wherein one of the first resonance frequency and the second resonance frequency is an integral multiple of the other.

* * * * *